United States Patent
Park et al.

(10) Patent No.: US 9,537,055 B2
(45) Date of Patent: Jan. 3, 2017

(54) SEMICONDUCTOR LIGHT EMITTING DIODE PACKAGE AND LIGHTING DEVICE USING THE SAME

(71) Applicant: SAMSUNG ELECTRONICS CO., LTD., Suwon-si, Gyeonggi-do (KR)

(72) Inventors: Myoung Bo Park, Suwon-Si (KR); Kyung Seok Oh, Seongnam-si (KR); Ho Young Song, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 203 days.

(21) Appl. No.: 14/490,475

(22) Filed: Sep. 18, 2014

(65) Prior Publication Data
US 2015/0109803 A1    Apr. 23, 2015

(30) Foreign Application Priority Data
Oct. 23, 2013  (KR) .................. 10-2013-0126501

(51) Int. Cl.
| H01L 33/38 | (2010.01) |
| H01L 33/62 | (2010.01) |
| H01L 33/40 | (2010.01) |
| H01L 33/42 | (2010.01) |
| H01L 33/44 | (2010.01) |
| H01L 33/48 | (2010.01) |

(52) U.S. Cl.
CPC .............. *H01L 33/38* (2013.01); *H01L 33/62* (2013.01); *H01L 33/405* (2013.01); *H01L 33/42* (2013.01); *H01L 33/44* (2013.01); *H01L 33/486* (2013.01); *H01L 2224/45139* (2013.01); *H01L 2224/48091* (2013.01); *H01L 2224/48465* (2013.01); *H01L 2224/49107* (2013.01)

(58) Field of Classification Search
CPC ..................... H01L 33/38; H01L 33/62; H01L 2224/45139; H01L 2224/48465; H01L 2224/49107; H01L 2224/48091; H01L 33/44; H01L 33/486; H01L 33/405; H01L 33/42
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |

(Continued)

Primary Examiner — Donald Raleigh
Assistant Examiner — Kevin Quarterman
(74) Attorney, Agent, or Firm — Lee & Morse, P.C.

(57) ABSTRACT

A semiconductor LED package includes a package body having first and second electrode structures and an LED chip connected to at least one of the first and second electrode structures using a wire. The LED chip includes a light emitting structure and first and second electrode parts. At least one of the first and second electrode parts includes a bonding electrode layer made of a material having the same composition as a material of the wire and bonded to the wire, and an uneven electrode layer disposed on the bonding electrode layer and having at least one through hole filled with the wire. The at least one through hole allows a top surface of the bonding electrode layer to be exposed therebelow.

15 Claims, 14 Drawing Sheets

(56) References Cited

U.S. PATENT DOCUMENTS

| | | |
|---|---|---|
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,128,444 B2 | 10/2006 | Isokawa et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,855,395 B2 | 12/2010 | Lee et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,053,805 B2 * | 11/2011 | Lim ............... H01L 33/38 257/99 |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |

* cited by examiner

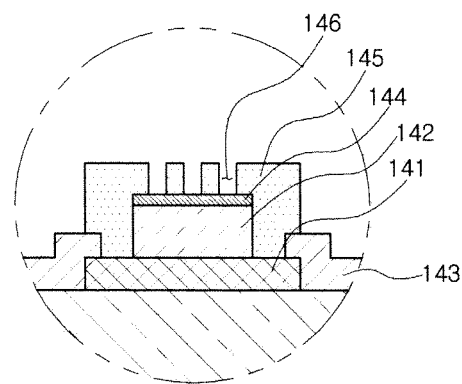
FIG. 2
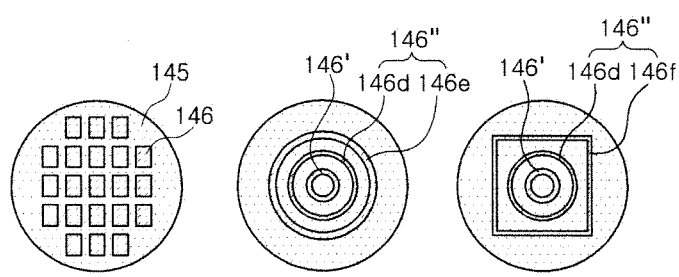
FIG. 3A    FIG. 3B    FIG. 3C
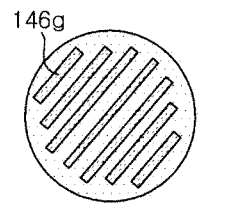 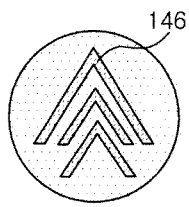
FIG. 3D    FIG. 3E

SEMICONDUCTOR LIGHT EMITTING DIODE PACKAGE AND LIGHTING DEVICE USING THE SAME

CROSS-REFERENCE TO RELATED APPLICATION

This application claims priority to, and benefit of Korean Patent Application No. 10-2013-0126501 filed on Oct. 23, 2013, with the Korean Intellectual Property Office, the entire contents of which are hereby incorporated by reference.

TECHNICAL FIELD

The present disclosure relates to a light emitting diode (LED) chip, a semiconductor LED package including the LED chip, and a lighting device using the semiconductor LED package.

BACKGROUND

A semiconductor light emitting device such as an LED is a device including a material that emits light using electric energy, in which energy generated through electron-hole recombination in semiconductor junction parts is converted into light and emitted therefrom. LEDs are commonly used as light sources in lighting devices, display devices, and the like, and development of LEDs has thus been accelerated.

In particular, the recent increase in development and use of gallium nitride-based LEDs and the commercialization of mobile keypads, turn signal lamps, camera flashes, and the like, using such gallium nitride-based LEDs, has led to accelerated development of general lighting devices using LEDs. Applications of LEDs are gradually moving from small portable products toward larger products having high output and high efficiency, such as a backlight unit of a large TV, a vehicle headlamp, a general lighting device, and the like. Accordingly, light sources satisfying requirements for corresponding applications are in need.

As the applications of semiconductor light emitting devices are extended, a method of improving reliability of semiconductor light emitting devices is being required.

SUMMARY

An aspect of the present disclosure relates to a semiconductor light emitting diode (LED) package having improved reliability.

An aspect of the present disclosure also relates to a lighting device having improved reliability.

One aspect of the present disclosure encompasses a semiconductor light emitting diode (LED) package including a package body having first and second electrode structures and an LED chip bonded to at least one of the first and second electrode structures of the package body using a wire. The LED chip includes a light emitting structure and first and second electrode parts. The light emitting structure includes a first conductivity type semiconductor layer, an active layer and a second conductivity type semiconductor layer sequentially stacked therein. The first and second electrode parts electrically connect the first and second conductivity type semiconductor layers to the first and second electrode structures, respectively. At least one of the first and second electrode parts includes a bonding electrode layer and an uneven electrode layer. The bonding electrode layer is made of a material having the same composition as a material of the wire and bonded to the wire. The uneven electrode layer is disposed on the bonding electrode layer and has at least one through hole formed therein. The at least one through hole is filled with a part of the wire and allows a top surface of the bonding electrode layer to be exposed therebelow.

The at least one through hole may include a plurality of through holes, and the plurality of through holes may have uniform intervals and sizes.

The through hole may have a circular or polygonal shape.

The through hole may have a first hole having a circular or polygonal shape and at least one second hole having a band shape surrounding the first hole.

An internal surface of the through hole may have a rounded edge.

An internal surface of the through hole may have a step structure.

An internal surface of the through hole may be inclined.

The semiconductor LED package may further include a bonding layer disposed on the top surface of the bonding electrode layer exposed below the through hole and an internal surface of the through hole and made of a material having the same composition as the material of the wire.

The wire may include a material selected from the group consisting of Au, Ag, Al, Cu and combinations thereof.

The bonding electrode layer may include 70% or more of the material having the same composition as the material of the wire.

A content of the material having the same composition within the bonding electrode layer may be greater than a content of the material within the wire.

The uneven electrode layer may be made of a material having a composition different from a material of the bonding electrode layer.

The uneven electrode layer may include 70% or more of the material having the composition different from the material of the bonding electrode layer.

The bonding electrode layer and the uneven electrode layer may be disposed in both the first and second electrode parts.

Another aspect of the present disclosure relates to a lighting device including a fixing structure; and an LED package. The LED package may be coupled to the fixing structure and configured to power through the fixing structure to emit light. The LED package may be the semiconductor LED package as described above.

Still another aspect of the present disclosure encompasses a light emitting diode (LED) chip including a light emitting structure and first and second electrode parts. The light emitting structure includes a first conductivity type semiconductor layer, an active layer and a second conductivity type semiconductor layer sequentially stacked therein. The first and second electrode parts electrically connect the first and second conductivity type semiconductor layers, respectively. At least one of the first and second electrode parts includes a transparent electrode layer, a bonding electrode layer, an uneven electrode layer and a reflective portion. The transparent electrode layer is disposed on a top surface of one of the first and second conductivity type semiconductor layers. The bonding electrode layer is disposed on the top surface of the one of the first and second conductivity type semiconductor layers. The uneven electrode layer is disposed on the bonding electrode layer and a portion of the transparent electrode layer and has at least one through hole formed therein. The at least one through hole allows a top surface of the bonding electrode layer to be exposed therebelow. The reflective portion is disposed below the bonding electrode layer to be free of contact with the transparent electrode layer.

The at least one through hole may include a plurality of through holes, and the plurality of through holes may have uniform intervals and sizes.

An internal surface of the through hole may have a rounded edge.

An internal surface of the through hole may have a step structure.

An internal surface of the through hole may be inclined.

BRIEF DESCRIPTION OF DRAWINGS

The above and other aspects, features and other advantages of the present disclosure will be more clearly understood from the following detailed description taken in conjunction with the accompanying drawings, in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

FIG. 2 is an enlarged view of part A of FIG. 1;

FIGS. 3A through 3E are plan views illustrating various shapes of through holes formed in an electrode part of FIG. 1.

DETAILED DESCRIPTION

Figure 1:
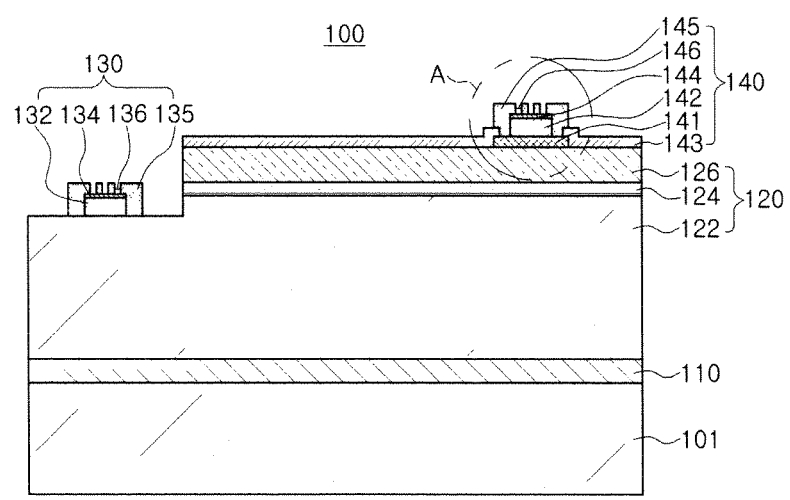
FIG. 1 is a cross-sectional view illustrating a light emitting diode (LED) chip according to an exemplary embodiment of the present inventive concept.

Exemplary embodiments of the present inventive concept will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a cross-sectional view illustrating a light emitting diode (LED) chip according to an exemplary embodiment of the present inventive concept, and FIG. 2 is an enlarged view of part A of FIG. 1.

With reference to FIG. 1, the LED chip 100 may include a light emitting structure 120 and first and second electrode parts 130 and 140 electrically connected to the light emitting structure 120.

The light emitting structure 120 may include semiconductor layers formed on a semiconductor growth substrate 101. The substrate 101 may be made of sapphire, SiC, $MgAl_2O_4$, MgO, $LiAlO_2$, $LiGaO_2$, GaN or the like. Sapphire is a crystal having Hexa-Rhombo R3C symmetry and has a lattice constant of 13.001 Å along a C-axis and a lattice constant of 4.758 Å along an A-axis. Orientation planes of sapphire include a C (0001) plane, an A (11-20) plane, an R (1-102) plane, and the like. The C plane may be mainly used as a substrate for nitride semiconductor growth because it facilitates the growth of a nitride film and is stable at high temperatures.

The substrate 101 may be a board having two opposing surfaces, and may have a thickness of 100 μm or less. For example, the thickness of the substrate 101 may be 1 μm to 20 μm, but is not limited thereto. Such a thickness range may be obtained by grinding the substrate provided for semiconductor growth. For example, the thickness of the substrate 101 may be adjusted by the following methods: a surface of the substrate, opposite to a surface thereof on which the light emitting structure 120 is formed, may be subjected to grinding, or may be subjected to lapping such that it is ground using a lap and lapping powder through abrasion and grinding actions.

The light emitting structure 120 may include a first conductivity type semiconductor layer 122, an active layer 124 and a second conductivity type semiconductor layer 126, sequentially disposed on the substrate 101. The first and second conductivity type semiconductor layers 122 and 126 may be n-type and p-type semiconductor layers made of nitride semiconductors, respectively. Although the present inventive concept is not limited thereto, according to an embodiment, the first and second conductivity type semiconductor layers 122 and 126 may be n-type and p-type semiconductor layers, respectively. The first and second conductivity type semiconductor layers 122 and 126 may be made of a material having a composition of $Al_xIn_yGa_{(1-x-y)}N$, where $0 \le x \le 1$, $0 \le y \le 1$ and $0 \le x+y \le 1$. For example, GaN, AlGaN, InGaN, or the like, may be used therefor.

The active layer 124 may be a layer for emitting visible light having a wavelength of approximately 350 nm to 680 nm. The active layer 124 may be formed of undoped nitride semiconductor layers having a single-quantum-well (SQW) structure or a multi-quantum-well (MQW) structure. For example, the active layer 124 may have an MQW structure in which, quantum barrier layers and quantum well layers are alternately stacked and both of the quantum barrier layers and the quantum well layers have a composition of $Al_xIn_yGa_{(1-x-y)}N$ and ($0 \le x \le 1$, $0 \le y \le 1$, and $0 \le x+y \le 1$) such that the active layer 124 may have a predetermined energy bandgap and emit light through recombination of electrons and holes in quantum wells. In the case of the MQW structure, for example, an InGaN/GaN structure may be used. The first and second conductivity type semiconductor layers 122 and 126 and the active layer 124 may be formed using crystal growth processes known in the art such as metal organic chemical vapor deposition (MOCVD), molecular beam epitaxy (MBE), hydride vapor phase epitaxy (HVPE), or the like.

A buffer layer 110 may be disposed between the substrate 101 and the light emitting structure 120. When the light emitting structure 120 is grown on the substrate 101, for example, when a GaN thin film is grown as a light emitting structure on a heterogeneous substrate, lattice defects such as dislocation may occur due to a lattice constant mismatch between the substrate and the GaN thin film, and cracks may occur in the light emitting structure due to the warpage of the substrate caused by a difference in the coefficient of thermal expansion between the substrate and the GaN thin film. In order to control these defects and warpage, the buffer layer 110 may be formed on the substrate 101 and a light emitting structure formed in a desired structure, for example, a nitride semiconductor structure, may be formed thereon. The buffer layer 110 may be a low-temperature buffer layer formed at a temperature lower than a single crystal growth temperature, but the present inventive concept is not limited thereto.

The buffer layer 110 may be made of a material having a composition of $Al_xIn_yGa_{1-x-y}N$, where $0 \le x \le 1$ and $0 \le y \le 1$, and particularly, GaN, AlN, and AlGaN may be used therefor. For example, the buffer layer may be an undoped GaN layer, which is not doped with impurities, and formed in a uniform thickness.

The buffer layer is not limited thereto, and any structure improving crystalline properties of the light emitting structure 120 may be employed, and materials such as $ZrB_2$, $HfB_2$, ZrN, HfN, TiN, ZnO, or the like, may also be used as the buffer layer. In addition, the buffer layer 110 may be formed by combining a plurality of layers, or the composition thereof may be gradually varied.

The first and second electrode parts 130 and 140 may be provided to allow the first and second conductivity type semiconductor layers 122 and 126 to be electrically connected to wires 150 (see FIGS. 11 and 12), respectively, and may be disposed to contact the first and second conductivity type semiconductor layers 122 and 126, respectively.

The first electrode part 130 may include a bonding electrode layer 134 bonded to the wires 150 and an uneven electrode layer 135 having a through hole 136 formed therein. Similarly, second electrode part 140 may include a bonding electrode layer 144 bonded to the wires 150 and an uneven electrode layer 145 having a through hole 146 formed therein.

Figure 11:
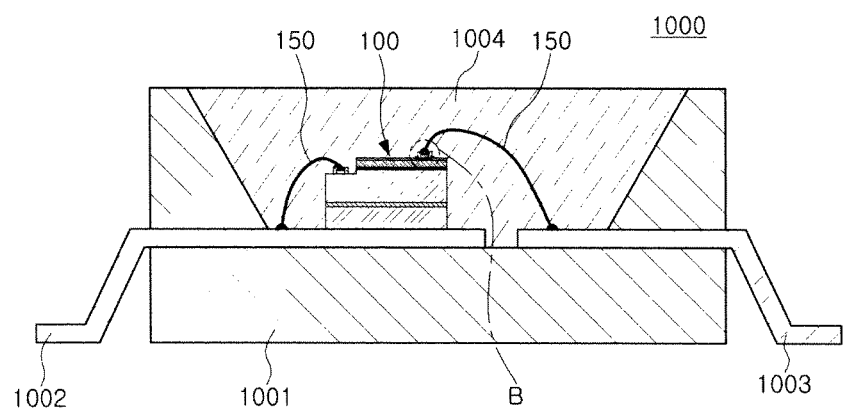
FIGS. 11 and 13 illustrate examples of a package using an LED chip according to exemplary embodiments of the present inventive concept.

Referring to FIGS. 1 and 2, the bonding electrode layers 134 and 144 may be electrically connected to the wires 150 at the time of wire bonding, and the connection structure therebetween will be described below with reference to FIGS. 11 and 12.

The bonding electrode layers 134 and 144 may be directly formed on the first and second conductivity type semiconductor layers 122 and 126, respectively. Alternatively, reflective portions 132 and 142 may be further formed below the bonding electrode layers 134 and 144, respectively. The reflective portions 132 and 142 may reflect light emitted from the active layer 124 by preventing the light from being absorbed into the first and second electrode parts 130 and 140, respectively, and surfaces thereof may be processed to be smooth in order to improve surface reflectivity. The reflective portions 132 and 142 may be made of a metal having high reflectivity selected from Al, Ag, Pt, Rh, Ru, Ni, Pd, Ir, Mg, Zn and Au. In addition, Ti may be deposited on top of the reflective portions 132 and 142, thereby preventing the reflective portions 132 and 142 from being oxidized.

A current blocking layer 141 may be formed below the reflective portion 142. Further, a transparent electrode layer 143 may be formed to cover a portion of the current blocking layer 141. The transparent electrode layer 143 may be a current diffusion layer and may be formed on a top surface of the second conductivity type semiconductor layer 126. The transparent electrode layer 143 may be formed of a transparent conductive oxide layer made of an oxide selected from ITO (Indium Tin Oxide), ZITO (Zinc-doped Indium Tin Oxide), ZIO (Zinc Indium Oxide), GIO (Gallium Indium Oxide), ZTO (Zinc Tin Oxide), FTO (Fluorine-doped Tin Oxide), AZO (Aluminium-doped Zinc Oxide), GZO (Gallium-doped Zinc Oxide), $In_4Sn_3O_{12}$ and $Zn_{(1-x)}MgO$ (Zinc Magnesium Oxide, $0 \le x \le 1$).

An opening OP may be formed in at least a portion of the transparent electrode layer 143 (see FIGS. 7 and 8), and the reflective portion 142 may be formed on the top surface of the second conductivity type semiconductor layer 126 or a top surface of the current blocking layer 141 exposed through the opening OP. The opening OP may be formed in a circular shape as viewed from the top, but is not limited thereto. The opening OP may be formed in various shapes.

The bonding electrode layers 134 and 144 may be formed on top surfaces of the reflective portions 132 and 142, respectively, or may be formed to cover top and side surfaces of the reflective portions 132 and 142, respectively.

The bonding electrode layers 134 and 144 may be made of a material having the same composition as that of the wires 150. For example, the bonding electrode layers 134 and 144 may be made of a material including at least one of Au, Ag, Cu, Zn, Al, In, Ti, Si, Ge, Sn, Mg, Ta, Cr, W, Ru, Rh, Ir, Ni, Pd, and Pt. When the bonding electrode layers 134 and 144 and the wires 150 are made of the same material, bonding strength at bonding interfaces between the bonding electrode layers 134 and 144 and the wires 150 may be increased. Even when the bonding electrode layers 134 and 144 and the wires 150 are not made of the same material, if the material having the same composition as the wires 150 is used as a main component of the bonding electrode layers 134 and 144, the bonding strength at the bonding interfaces may be increased. For example, when the material having the same composition as that of the wires 150 makes up 70% or more of the material forming the bonding electrode layers 134 and 144, the bonding strength at the bonding interfaces may be increased. In addition, a content of the same material within the bonding electrode layers 134 and 144 may be greater than a content of the same material within the wires 150.

In this case, a material for the bonding electrode layers 134 and 144 may be appropriately selected according to a material, a structure or a component mounting state of a semiconductor LED package.

The uneven electrode layers 135 and 145 may be formed on the bonding electrode layers 134 and 144, respectively. The uneven electrode layers 135 and 145 may have one or more through holes 136 and 146 formed in a thickness direction, respectively, and portions of the top surfaces of the bonding electrode layers 134 and 144 may be exposed below the through holes 136 and 146, respectively.

FIGS. 3A through 3E are plan views illustrating various shapes of the through holes 136 and 146. The through holes 136 and 146 may be formed in a circular shape when viewed from the top. In addition, as illustrated in FIG. 3A, the through holes 146 may have a polygonal shape, and may be arranged to have uniform intervals and sizes like a lattice or come in various arrangements like a zigzag arrangement. In the case of the structure illustrated in FIG. 3B, the through holes may be divided into two parts. Specifically, the through holes may include a first hole 146' having a circular shape and a second hole 146" having a plurality of bands 146d and 146e surrounding the first hole. Alternatively, as illustrated in FIG. 3C, the second hole 146" may include a polygonal shape band 146f. Alternatively, as illustrated in FIG. 3D, the through holes may be formed as a plurality of parallel lines 146g, or as illustrated in FIG. 3E, the through holes may be formed as a plurality of bent lines 146h.

Figure 4A:
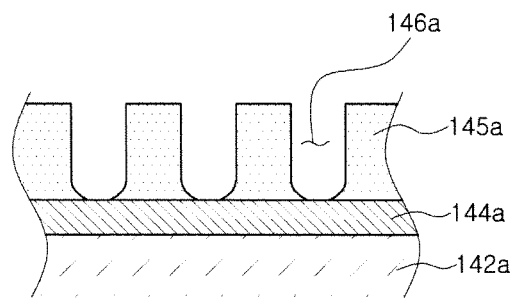
FIGS. 4A through 4C are cross-sectional views illustrating modified examples of through holes formed in the electrode part of FIG. 1.
Figure 4B:
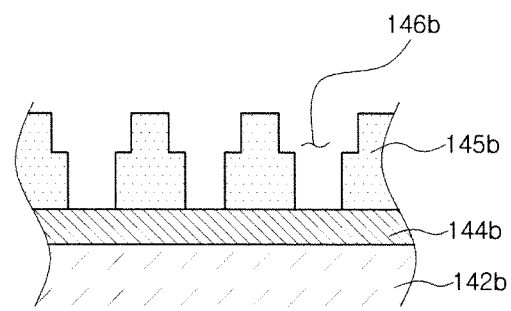
Figure 4C:
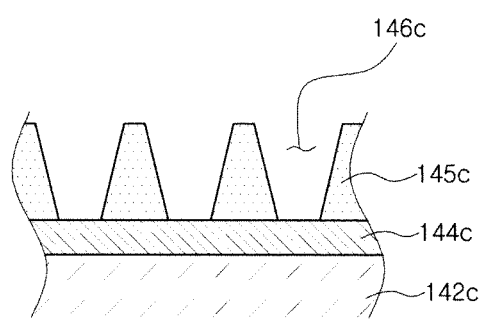

FIGS. 4A through 4C are cross-sectional views illustrating modified examples of the through holes 136 and 146. Internal surfaces of the through holes 136 and 146 may be formed to have a quadrangular cross-sectional shape as illustrated in FIG. 2, or the edges of the internal surfaces may be rounded as illustrated in FIG. 4A (see a reflective portion 142a, a bonding electrode layer 144a, an uneven electrode layer 145a and a through hole 146a in FIG. 4A). Alternatively, the internal surfaces may have a step structure as illustrated in FIG. 4B (see a reflective portion 142b, a bonding electrode layer 144b, an uneven electrode layer 145b and a through hole 146b in FIG. 4B), and may be inclined as illustrated in FIG. 4C (see a reflective portion 142c, a bonding electrode layer 144c, an uneven electrode layer 145c and a through hole 146c in FIG. 4C).

The uneven electrode layers 135 and 145 may be formed to have a single layer or a multilayer structure using a conductive material having ohmic contact with the first and second conductivity type semiconductor layers 122 and 126, respectively. For example, the uneven electrode layers 135 and 145 may be formed by depositing or sputtering at least one of Au, Ag, Cu, Zn, Al, In, Ti, Si, Ge, Sn, Mg, Ta, Cr, W, Ru, Rh, Ir, Ni, Pd, and Pt. Here, the uneven electrode layers 135 and 145 may be made of a material having a different composition from that of the bonding electrode layers 134 and 144, respectively. For example, the material having the different composition may make up 70% or more of the material of the uneven electrode layers 135 and 145.

Figure 12:
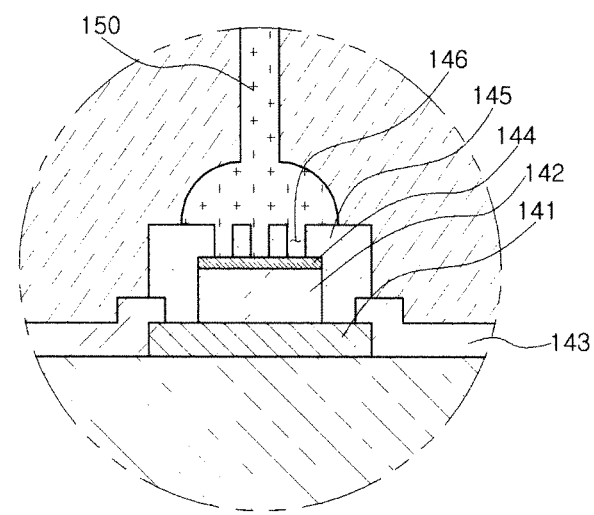
FIG. 12 is an enlarged view of part B of FIG. 11.

The through holes 136 and 146 of the uneven electrode layers 135 and 145 may be wire-bonded to the wires 150, whereby the wires 150 may fill the through holes 136 and 146 (see FIG. 12). The top surfaces of the bonding electrode layers 134 and 144 may be exposed below the through holes 136 and 146, respectively, thereby being directly bonded to the wires 150.

Therefore, even when the wires 150 made of a different material from that of the uneven electrode layers 135 and 145 are bonded to the uneven electrode layers 135 and 145 forming the surfaces of the first and second electrode parts 130 and 140, because the bonding electrode layers 134 and 144 are disposed below the uneven electrode layers 135 and 145, the bonding electrode layers 134 and 144 made of the same material as that of the wires 150 may be bonded to one another with increased bonding strength therebetween.

Figure 5:
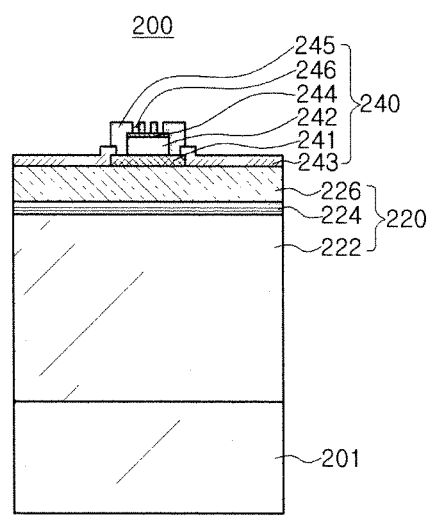
FIG. 5 is a cross-sectional view illustrating an LED chip according to another exemplary embodiment of the present inventive concept.

Hereinafter, an LED chip 200 according to another exemplary embodiment of the present inventive concept will be described. FIG. 5 is a cross-sectional view of the LED chip 200 according to another exemplary embodiment of the present inventive concept. As compared with the above-described embodiment of FIGS. 1-4, first and second electrode parts according to an embodiment may be disposed to oppose one another with respect to a light emitting structure 220, i.e., a first conductivity type semiconductor layer 226, an active layer 224 and a second conductivity type semiconductor layer 222.

A conductive support substrate 201 disposed opposite to a first electrode part 240 may serve to support the light emitting structure 220 during a laser lift-off process or the like, and may also serve as a second electrode part making electrical connection with the second conductivity type semiconductor layer 222. The second electrode part 240 may include a reflective portion 242, a current blocking layer 241 formed below the reflective portion 242, a transparent electrode layer 143, a bonding electrode layer 244 and an uneven electrode layer 245 having a through hole 246 formed therein. The substrate 201 may be made of a material including at least one of Au, Ni, Al, Cu, W, Si, Se, and GaAs. For example, the substrate 201 may be made of Si doped with Al. In this case, the conductive support substrate 201 may be formed by plating, bonding, or the like, according to selected materials. As described above, in the LED chip 200 according to an exemplary embodiment of the present inventive concept, only the first electrode part 240 may be subjected to wire-bonding, whereby the probability of wire bonding defects may be further reduced as compared to the aforementioned embodiment of FIG. 1. Similar to the electrode part 140 illustrated in FIG. 2, the first electrode part 240 of FIG. 5 may include a current blocking layer 241, a reflective portion 242, a transparent electrode layer 243, a bonding electrode layer 244, an uneven electrode layer 245, and through holes 246.

Hereinafter, an example of a semiconductor LED package 1000 using the LED chip 100 according to an exemplary embodiment of the present inventive concept will be described with reference to FIGS. 11 and 12. The semiconductor LED package 1000 may include a package body 1001 and the LED chip 100 wire-bonded to the package body 1001.

The package body 1001 may be provided with first and second electrode structures 1002 and 1003, and the LED chip 100 may be mounted on the first and second electrode structures 1002 and 1003. The first and second electrode parts 130 and 140 of the LED chip 100 may be electrically connected to the first and second electrode structures 1002 and 1003 using the wires 150 made of a conductive metal.

Here, the package body 1001 may be made of an organic resin material containing epoxy, triazine, silicon, polyimide, or the like, and other organic resin materials, or may be made of a ceramic material having high thermal resistance, superior thermal conductivity, and high reflectivity in order to improve heat dissipation and light emitting efficiency, such as $Al_2O_3$, AlN, or the like. However, the material of the package body 1001 is not limited thereto, and various materials may be used in consideration of the heat dissipation characteristics and electrical connections of the semiconductor LED package 1000.

Apart from the above-described ceramic substrate, a printed circuit board, a lead frame, or the like may be used as the package body 1001 according to an embodiment of the present inventive concept. The package body 1001 may have a cup-like shape to improve light reflectivity. A sealing body 1004 made of a light transmissive material may be disposed in the reflective cup to seal the LED chip 100, the wires 150, and the like.

The first and second electrode parts 130 and 140 may be bonded to the respective wires 150. The wires 150 may be made of a conductive material including at least one of Au, Ag, Cu, Zn, Al, In, Ti, Si, Ge, Sn, Mg, Ta, Cr, W, Ru, Rh, Ir, Ni, Pd, Pt and the like. As described above, the wires 150 may include the material having the same composition as that of the bonding electrode layers 134 and 144 and be made of the material different from that of the uneven electrode layers 135 and 145, thereby increasing bonding strength.

Details thereof will be provided below. In general, when a same metal is used on a wire and a bonding region, excellent bonding strength is secured, but expensive metals like Au increase cost of production, thereby decreasing price competitiveness. On the other hand, when inexpensive metals like Ag, Al, Cu, and the like, are used to form the wire and the bonding region, the cost of production may be lowered, but corrosion resistance of a surface of the bonding region may not be secured and reliability of a bonding interface also may not be secured due to electromigration.

Also, when the wire and the bonding region are formed of dissimilar metals, an intermetallic compound may be formed in the bonding region and cause interfacial degradation, whereby bonding strength at the bonding interface may be decreased. When the wire is repeatedly expanded and contracted by heat emitted from an LED chip, stress is applied to the wire, thereby degrading the bonding strength at the bonding interface. Therefore, in order to secure reliability of the bonding interface, an area of the bonding interface should be further expanded.

In an embodiment of the present inventive concept, the wires 150 and the uneven electrode layers 135 and 145 may be made of dissimilar metals to be subjected to dissimilar metal bonding, while the wires 150 are bonded to the bonding electrode layers 134 and 144 having the same composition as that of the wires 150 using the through holes 136 and 146 of the uneven electrode layers 135 and 145, whereby the problems of the dissimilar metal bonding may be solved. In addition, the wires 150 may be bonded to internal surfaces of the through holes 136 and 146 and portions of the top surfaces of the bonding electrode layers 134 and 144 exposed below the through holes 136 and 146, whereby an area of the bonding interfaces may be expanded. Therefore, even when the wires having the same diameter are bonded, bonding strength may be further increased.

Intervening layers having the same composition as that of the wires 150 may be further formed on portions of the top surfaces of the uneven electrode layers 135 and 145, the internal surfaces of the through holes 136 and 146, and portions of the top surfaces of the bonding electrode layers 134 and 144 exposed below the through holes 136 and 146 to be in contact with the wires 150. In this case, the bonding strength at the bonding interfaces may be further increased, whereby the reliability of the LED package may be further improved.

Hereinafter, a method of manufacturing the LED chip of FIG. 1 will be described with reference to FIGS. 6 through 10.

Figure 6:
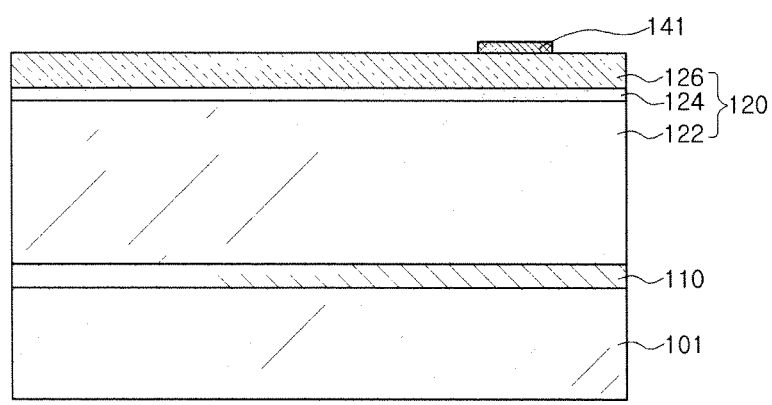
FIGS. 6 through 10 are views illustrating a method of manufacturing the LED chip of FIG. 1.

First of all, as illustrated in FIG. 6, the buffer layer 110, the light emitting structure 120 and the current blocking layer 141 may be formed on the substrate 101. The buffer layer 110 may not be formed depending on circumstances. The light emitting structure 120 including the first and second conductivity type semiconductor layers 122 and 126 and the active layer 124 disposed therebetween may be formed on the buffer layer 110.

The light emitting structure 120 may be grown by metal organic chemical vapor deposition (MOCVD), molecular beam epitaxy (MBE), hydride vapor phase epitaxy (HVPE), or the like.

The current blocking layer 141 may be formed on the second conductivity type semiconductor layer 126 in a region thereof in which the second electrode part 140 is to be formed. The current blocking layer 141 may be made of an insulating material. In an embodiment of the present inventive concept, the current blocking layer 141 is made of $SiO_2$.

Figure 7:
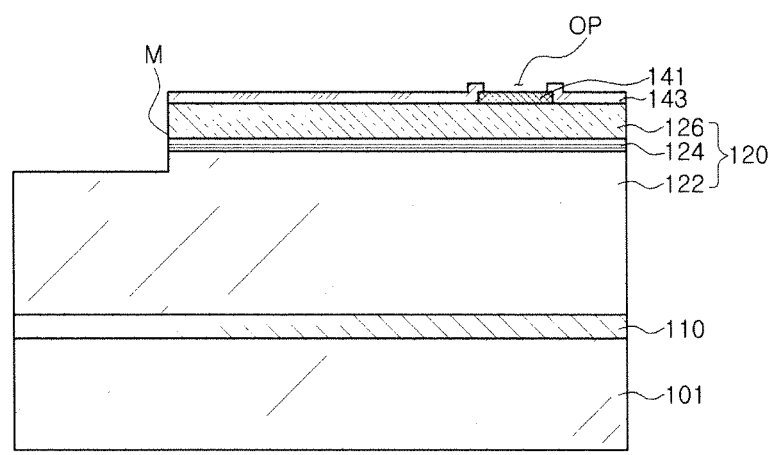

Next, as illustrated in FIG. 7, the transparent electrode layer 143 may be formed on the second conductivity type semiconductor layer 126 to cover a portion of the current blocking layer 141, such that the opening OP is formed in a region of the transparent electrode layer 143 in which the second electrode part 140 is to be formed. In addition, the transparent electrode layer 143, the second conductivity type semiconductor layer 126 and the active layer 124 may be etched to form a mesa-etched surface M.

Figure 8:
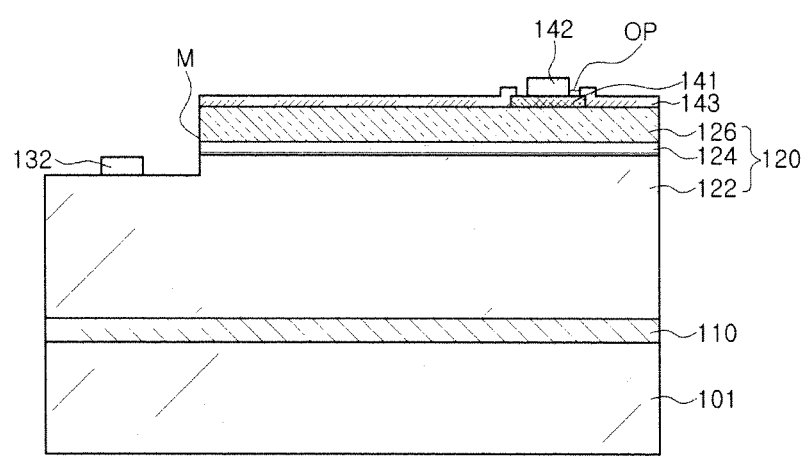

Thereafter, as illustrated in FIG. 8, the reflective portion 132 may be formed on the first conductivity type semiconductor layer 122 exposed through the mesa-etched surface M, and the reflective portion 142 may be formed within the opening OP. When the reflective portion 142 contacts the transparent electrode layer 143, the transparent electrode layer 143 may undergo discoloration and the extraction efficiency of light emitted from the active layer 124 may be lowered. Therefore, the reflective portion 142 may be formed within the opening OP so as not to be in contact with the transparent electrode layer 143.

Figure 9:
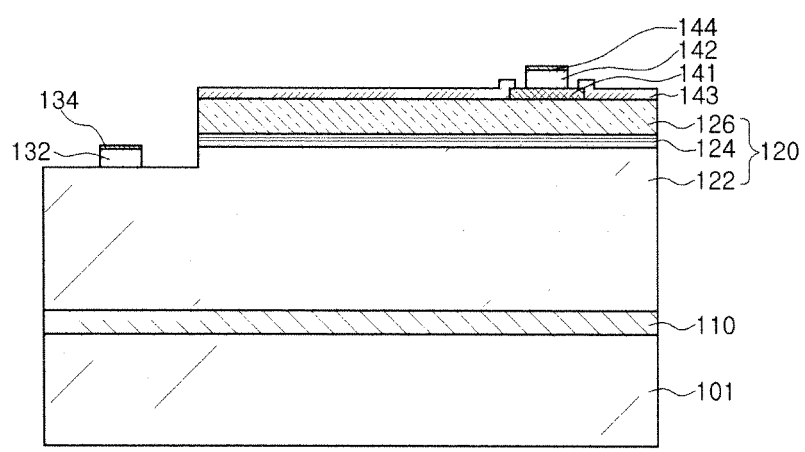

Then, as illustrated in FIG. 9, the bonding electrode layers 134 and 144 may be formed on the reflective portions 132 and 142, respectively. As described above, the bonding electrode layers 134 and 144 may be made of the material having the same composition as that of the wires 150. Specifically, the bonding electrode layers 134 and 144 may be formed by depositing one of high conductive metals including Al, Ag, Pt, Rh, Ru, Ni, Pd, Ir, Mg, Zn and Au. In addition, Ti may be deposited on the top of the reflective portions 132 and 142 to prevent the reflective portions 132 and 142 from being oxidized.

Figure 10:
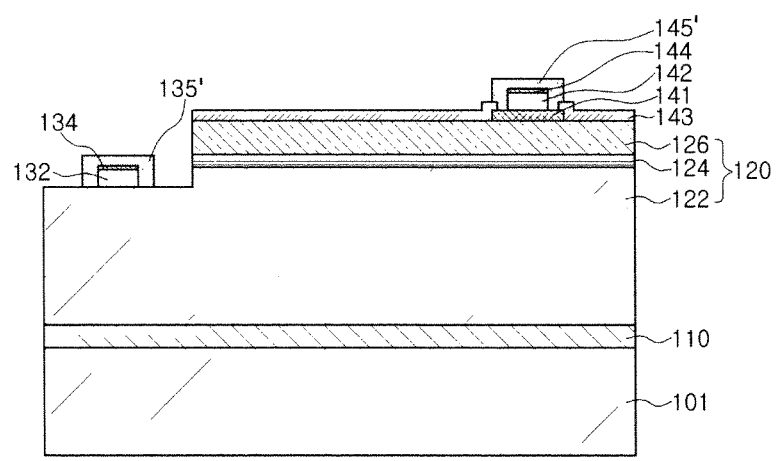

Then, as illustrated in FIG. 10, an electrode layer 135' may be formed to enclose the bonding electrode layer 134 and the reflective portion 132, using a material having a different composition from that of the bonding electrode layer 134. Similarly, an electrode layer 145' may be formed to enclose the bonding electrode layer 144 and the reflective portion 142, using a material having a different composition from that of the bonding electrode layer 144. Specifically, the electrode layers 135' and 145' may be formed by depositing one of high conductive metals including Al, Ag, Pt, Rh, Ru, Ni, Pd, Ir, Mg, Zn and Au.

The through holes 136 and 146 may be formed in the electrode layers 135a and 145d, respectively, thereby forming the uneven electrode layers 135 and 145. The through holes 136 and 146 may be formed using various methods. As an exemplary method, after a metal electrode is formed to have a predetermined shape on a surface of a conductive semiconductor layer using a method of electrode formation, holes may be selectively formed in the metal electrode using a focused ion beam or an e-beam, or the metal electrode may be selectively etched to form through holes using various lithography methods such as photolithography, holographic lithography or nano-imprint lithography. For example, various dry and wet etching methods, such as inductively coupled plasma reactive-ion etching (ICP-RIE), chemical etching, and the like, may be used.

Figure 13:
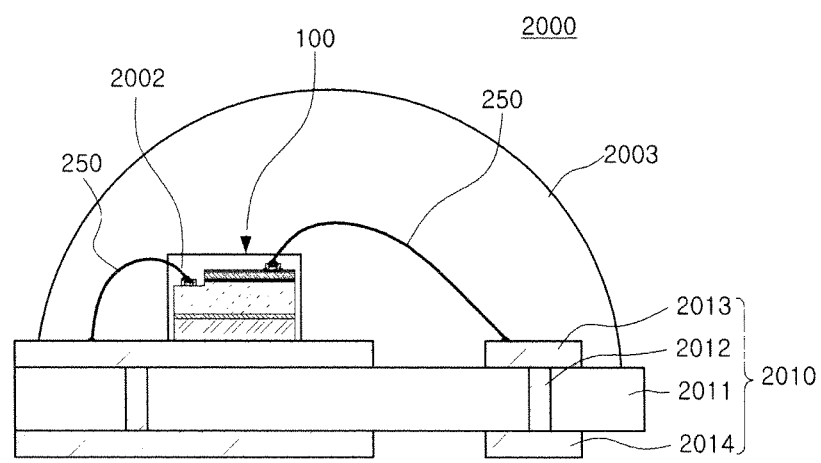

FIG. 13 illustrates an example of a semiconductor LED package using the LED chip according to another exemplary embodiment of the present inventive concept.

With reference to FIG. 13, a semiconductor LED package 2000 may include the LED chip 100, a mounting substrate 2010 and a sealing body 2003. In addition, a wavelength conversion part 2002 may be formed on top and side surfaces of the LED chip 100. The LED chip 100 may be mounted on the mounting substrate 2010 and electrically connected thereto using wires 250.

The mounting substrate 2010 may include a substrate body 2011, a top electrode 2013 and a bottom electrode 2014. In addition, the mounting substrate 2010 may further include a through electrode 2012 connecting the top electrode 2013 to the bottom electrode 2014. The mounting substrate 2010 may be a printed circuit board (PCB), a metal core printed circuit board (MCPCB), a metal printed circuit board (MPCB), a flexible printed circuit board (FPCB), or the like, and the structure thereof may be varied.

The wavelength conversion part 2002 may include a phosphor, a quantum dot or the like. The sealing body 2003 may be formed to have a dome-shaped lens structure of which a top surface is convex. According to exemplary embodiments, the surface of the sealing body 2003 may form a convex or concave lens structure, such that the angle of light emitted through the top surface of the sealing body 2003 may be adjusted.

Figure 14:
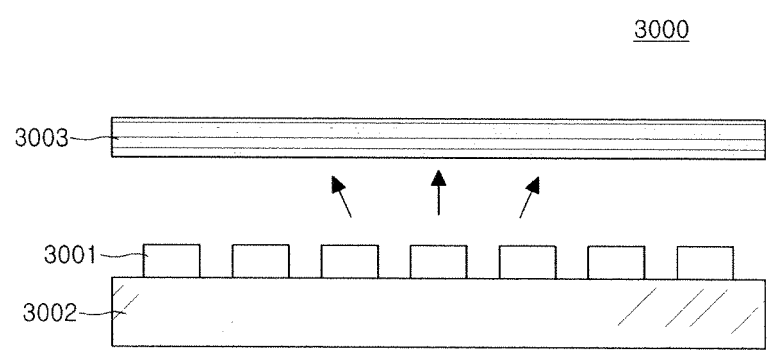
FIGS. 14 and 15 illustrate examples of a semiconductor LED package using an LED chip according to an exemplary embodiment of the present inventive concept applied to a backlight unit.
Figure 15:
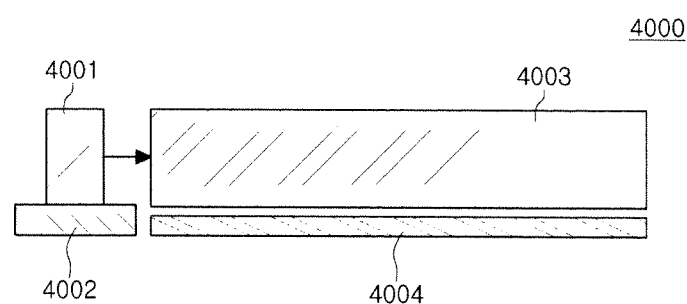

FIGS. 14 and 15 illustrate examples of a semiconductor LED package using an LED chip according to an exemplary embodiment of the present inventive concept applied to a backlight unit.

With reference to FIG. 14, a backlight unit 3000 may include at least one light source 3001 mounted on a substrate 3002 and at least one optical sheet 3003 disposed thereabove. The light source 3001 may be a semiconductor LED package having the same structure as the above-described structures of FIGS. 11 and 13 or a structure similar thereto, or a chip-on-board (COB) type package in which any one of the LED chips of FIGS. 1 and 5 is directly mounted on the substrate 3002.

The light source 3001 in the backlight unit 3000 of FIG. 14 may emit light toward a liquid crystal display (LCD) device disposed thereabove, whereas a light source 4001 mounted on a substrate 4002 in a backlight unit 4000 according to another embodiment illustrated in FIG. 15 may emit light laterally. The light may be incident to a light guide plate 4003 such that the backlight unit 4000 may serve as a surface light source. The light travelling to the light guide plate 4003 may be emitted upwardly and a reflective layer 4004 may be formed below a lower surface of the light guide plate 4003 in order to improve light extraction efficiency.

Figure 16:
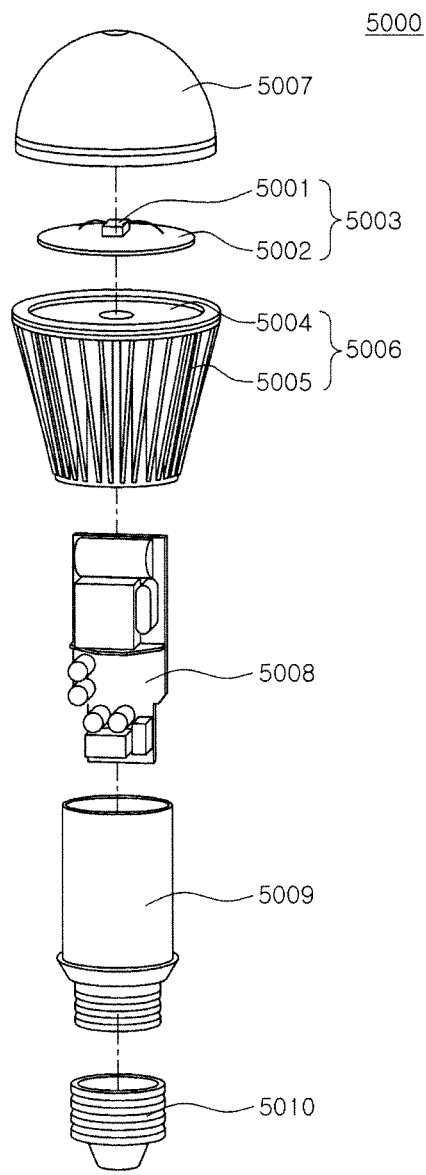
FIG. 16 illustrates an example of a semiconductor LED package using an LED chip according to an exemplary embodiment of the present inventive concept applied to a lighting device.

FIG. 16 illustrates an example of a semiconductor LED package using an LED chip according to an exemplary embodiment of the present inventive concept applied to a lighting device.

With reference to an exploded perspective view of FIG. 16, a lighting device 5000 is exemplified as a bulb-type lamp, and may include a light emitting module 5003, a driver 5008 and an external connector 5010. In addition, the lighting device 5000 may further include exterior structures such as external and internal housings 5006 and 5009, a cover 5007, and the like. The light emitting module 5003 may include a light source 5001 having the same structure as that of the LED package of FIG. 11 or 13 or a structure similar thereto, and a circuit board 5002 having the light source 5001 mounted thereon. In an embodiment of the present inventive concept, a single light source 5001 is mounted on the circuit board 5002 by way of example; however, a plurality of light sources may be mounted thereon as necessary.

The external housing 5006 may serve as a heat radiator and may include a heat sink plate 5004 directly contacting the light emitting module 5003 to thereby improve heat dissipation and heat radiating fins 5005 surrounding a lateral surface of the lighting device 5000. The cover 5007 may be disposed above the light emitting module 5003 and have a convex lens shape. The driver 5008 may be disposed inside the internal housing 5009 and be connected to the external connector 5010 such as a socket structure to receive power from an external power source. In addition, the driver 5008 may convert the received power into power appropriate for driving the light source 5001 of the light emitting module 5003 and supply the converted power thereto. For example, the driver 5008 may be provided as an AC-DC converter, a rectifying circuit part, or the like.

Although not shown, the lighting device 5000 may further include a communications module.

Figure 17:
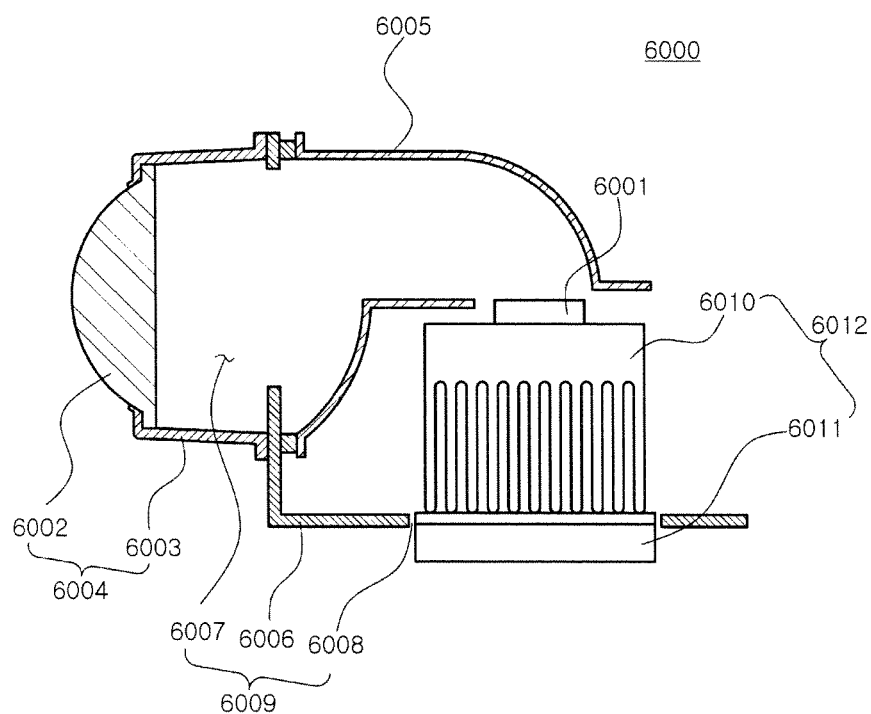
FIG. 17 illustrates an example of a semiconductor LED package using an LED chip according to an exemplary embodiment of the present inventive concept applied to a headlamp.

FIG. 17 illustrates an example of a semiconductor LED package using an LED chip according to an exemplary embodiment of the present inventive concept applied to a headlamp.

With reference to FIG. 17, a headlamp 6000 used in a vehicle or the like may include a light source 6001, a reflector 6005 and a lens cover 6004. The lens cover 6004 may include a hollow guide part 6003 and a lens 6002. The light source 6001 may include at least one semiconductor LED package illustrated in FIGS. 11 through 13.

The headlamp 6000 may further include a heat radiator 6012 externally dissipating heat generated in the light source 6001. The heat radiator 6012 may include a heat sink 6010 and a cooling fan 6011 in order to effectively dissipate heat. In addition, the headlamp 6000 may further include a housing 6009 allowing the heat radiator 6012 and the reflector 6005 to be fixed thereto and supporting them. The housing 6009 may include a body 6006 and a central hole 6008 formed in one surface thereof, to which the heat radiator 6012 is coupled.

The housing 6009 may include a forwardly open hole 6007 formed in the other surface thereof integrally connected to the one surface thereof and bent in a direction perpendicular thereto. The reflector 6005 may be fixed to the housing 6009, such that light generated in the light source 6001 may be reflected by the reflector 6005, pass through the forwardly open hole 6007, and be emitted outwards.

As set forth above, a semiconductor LED package according to exemplary embodiments of the present inventive concept may have improved reliability.

A lighting device according to exemplary embodiments of the present inventive concept may have improved reliability.

While exemplary embodiments have been shown and described above, it will be apparent to those skilled in the art that modifications and variations could be made without departing from the spirit and scope of the present disclosure as defined by the appended claims.

What is claimed is:

1. A semiconductor light emitting diode (LED) package comprising:
    a package body having first and second electrode structures; and
    an LED chip bonded to at least one of the first and second electrode structures of the package body using a wire, wherein the LED chip comprises:
    a light emitting structure including a first conductivity type semiconductor layer, an active layer and a second conductivity type semiconductor layer sequentially stacked therein;
    a first electrode part electrically connecting the first conductivity type semiconductor layer to the first electrode structure; and
    a second electrode part electrically connecting the second conductivity type semiconductor layer to the second electrode structure, wherein
    at least one of the first and second electrode parts comprises:

a bonding electrode layer made of a material having the same composition as a material of the wire and bonded to the wire; and an uneven electrode layer disposed on the bonding electrode layer and having at least one through hole formed therein, the at least one through hole being filled with a part of the wire and allowing a top surface of the bonding electrode layer to be exposed therebelow.

2. The semiconductor LED package of claim 1, wherein:
the at least one through hole comprises a plurality of through holes, and
the plurality of through holes have uniform intervals and sizes.

3. The semiconductor LED package of claim 1, wherein the through hole has a circular or polygonal shape.

4. The semiconductor LED package of claim 1, wherein the through hole has a first hole having a circular or polygonal shape and at least one second hole having a band shape surrounding the first hole.

5. The semiconductor LED package of claim 1, wherein an internal surface of the through hole has a rounded edge.

6. The semiconductor LED package of claim 1, wherein an internal surface of the through hole has a step structure.

7. The semiconductor LED package of claim 1, wherein an internal surface of the through hole is inclined.

8. The semiconductor LED package of claim 1, further comprising a bonding layer disposed on the top surface of the bonding electrode layer exposed below the through hole and an internal surface of the through hole and made of a material having the same composition as the material of the wire.

9. The semiconductor LED package of claim 1, wherein the wire includes a material selected from the group consisting of Au, Ag, Al, Cu and combinations thereof.

10. The semiconductor LED package of claim 1, wherein the bonding electrode layer includes 70% or more of the material having the same composition as the material of the wire.

11. The semiconductor LED package of claim 10, wherein a content of the material having the same composition within the bonding electrode layer is greater than a content of the material within the wire.

12. The semiconductor LED package of claim 1, wherein the uneven electrode layer is made of a material having a composition different from a material of the bonding electrode layer.

13. The semiconductor LED package of claim 12, wherein the uneven electrode layer includes 70% or more of the material having the composition different from the material of the bonding electrode layer.

14. The semiconductor LED package of claim 1, wherein the bonding electrode layer and the uneven electrode layer are disposed in both the first and second electrode parts.

15. A lighting device comprising:
a fixing structure; and
an LED package coupled to the fixing structure and configured to receive power through the fixing structure to emit light,
wherein the LED package is the semiconductor LED package of claim 1.

* * * * *